United States Patent [19]

Kim

[11] 3,853,496

[45] Dec. 10, 1974

[54] METHOD OF MAKING A METAL INSULATOR SILICON FIELD EFFECT TRANSISTOR (MIS-FET) MEMORY DEVICE AND THE PRODUCT

[75] Inventor: Manjin J. Kim, Liverpool, N.Y.

[73] Assignee: General Electric Company, Syracuse, N.Y.

[22] Filed: Jan. 2, 1973

[21] Appl. No.: 319,991

[52] U.S. Cl. .................................... 29/571, 29/578

[51] Int. Cl. .......................................... H01l 11/14

[58] Field of Search .............. 29/571, 578; 117/118; 11/201; 317/235

[56] References Cited

UNITED STATES PATENTS

| | | | |
|---|---|---|---|
| 2,930,722 | 3/1960 | Ligenza | 148/1.5 |
| 3,504,430 | 4/1970 | Kubo | 29/571 |
| 3,646,665 | 3/1972 | Kim | 29/578 |
| 3,649,886 | 3/1972 | Kool | 29/571 |
| 3,670,403 | 6/1972 | Lawrence | 29/571 |

*Primary Examiner*—Roy Lake
*Assistant Examiner*—R. Daniel Crouse
*Attorney, Agent, or Firm*—Richard V. Lang; Carl W. Baker; Frank L. Neuhauser

[57] ABSTRACT

The present invention relates to the method of making a memory device of the metal insulator silicon field effect transistor structure having a gate region combining a chemically formed thin oxide layer and a second insulating layer, such as silicon nitride, and to the novel product which results from this method. The method entails the step of chemically oxidizing the surface of the silicon channel region by a self-limiting process to form a thin porous oxide, and a nitriding step which is conducted under conditions producing optimum interface traps and minimum initial charge. Both steps lead to highly reproducible devices. The method is readily applied to large arrays of devices, offering ease of manufacture and close device parameter control. One form of the process provides for the production of both memory and read-out devices appropriate in an array.

6 Claims, 9 Drawing Figures

PATENTED DEC 10 1974 3,853,496

METHOD OF MAKING A METAL INSULATOR SILICON FIELD EFFECT TRANSISTOR (MIS-FET) MEMORY DEVICE AND THE PRODUCT

BACKGROUND OF THE INVENTION

1. Field of the Invention

The present invention relates to a method of making MIS-FET memory devices which are capable of storing a charge in a double layer insulated gate region. The method more particularly relates to the method of forming the two insulating layers, and of improving the method for manufacture of the memory device to accommodate fabrication of readout elements as well. The invention also relates to the product of the process, MIS-FET memory devices.

2. Description of the Prior Art

The inventive product may be regarded as structurally and functionally related to the conventional MOS-FET, of which the enhancement mode P-channel MOS-FET is an example. Such devices are described in the *Motorola Data Book*, Fourth Edition, pages AN4-7–AN57. Such a device comprises an N-silicon substrate of high resistivity (5 ohm cm, typically) with source and drain regions of high conductivity (50 ohm per square, typically) P-silicon. A gate region is formed in the substrate between the source and drain. The gate comprises an insulating layer of $SiO_2$ applied over the gate region, and a thin layer of $Si_3N_4$ over the $SiO_2$ for passivation. Electrode metallizations are applied to the source, drain and gate.

The FET transistor resembles a vacuum tube with a control grid in that the gate control of the drain current is by an electric field, and there is a threshold at which conduction begins. With customary potential differences between source and drain, and "zero" gate to substrate potential, the device appears to be a pair of back to back diodes, and no current flows. With a negative potential on the gate, field induced positive holes appear at the upper surface of the channel until the region beneath the oxide becomes effectively a p-type semiconductor region, permitting current to flow between source and drain through the induced "P channel". The threshold of conduction occurs at the point where the concentration of minority carriers at the surface equals the impurity concentration in the bulk semiconductor. The current flow between source and drain increases with increased negative gate potential, leading this mode of operation to be characterized as the "enhancement mode". The oxide layer of conventional MOS-FETs is normally thick enough to remain insulating under the customary ranges of applied gate potentials and the nitride is normally very thin, serving primarily as a passivation layer to protect the under layers from sodium contamination.

The insulated gate field effect transistor was originally used primarily for linear signal operation. However, when the gate oxide was replaced or combined with other insulators, as for instance nitride ($Si_3N_4$), it was found that the MIS (Metal Insulation Silicon) - FET devices as they are generically called, often exhibited a new property. In the case of the metal nitride oxide field effect transistor (MNOS-FET), the conduction characteristic is a slightly curving function of the gate potential, curving more in the region of the threshold and approaching linearity at higher values. For small ranges of variation in gate potentials, the conduction characteristic is retraceable. For larger values of gate voltage, the conduction characteristic is shifted with high gate voltages. This displacement is explained as arising from charges drawn into the insulating layers, where they become trapped and influence conduction in the channel region. The effect displaces both the "linear" portion and the threshold region of the conduction characteristic. The displacement can be removed by either applying a strong opposite (positive) gate potential to remove the trapped charges or by waiting a long enough time for them to leak out naturally. In conventional linear MIS-FETS, the hysteresis property is small, and unoptimized.

The variable threshold effect led to the development of MIS-FET devices optimized as memory devices. Since the threshold of conduction is distinct in FETs, the unoptimized devices could be used in non-linear or switching modes for active logic applications. When it became apparent that the position of their thresholds could be varied by control of charges trapped in the gate region, interest grew in using this phenomenon for passive logic applications, i.e. data storage. Since the trapped charges did not require external fields for their continuance, they promised an electronic memory not requiring the continuous supply of energy for memory retention. The insulation would, however, have to be good enough to keep the "trapped" charges long enough. The MNOS-FET and the MAOS-FET devices are two variable threshold devices resulting from this activity. In the MAOS-FET device the gate region also uses two distinct insulating layers, a silicon oxide layer and an aluminum oxide ($Al_2O_3$) layer and trapping is accomplished at their isolated interface.

MIS-FET memory devices are widely reported, but continue to exhibit great variability. Frohman-Bentchkowsky and Lenzlinger, in an article entitled "Charge Transport and Storage in Metal-Nitride-Silicon MNOS Structures", *Journal of Applied Physics*, Volume 40, pp. 3307–3319, 1969, proposed an oxide layer of 50–200A thickness and a nitride layer of 200–1000A thickness. A thinner oxide 15–35A was proposed by J. T. Wallmark and J. H. Scott, in an article entitled "Switching and Storage Characteristics of MIS Memory Transistors", in the *RCA Review*, Volume 30, pp. 335–365, 1969. A similar device was discussed by E. C. Ross and J. T. Wallmark in an article entitled "Theory of the Switching Behavior of MIS Memory Transistors" in the *RCA Review*, Volume 30, pp. 336–381, 1969.

With varying degrees of successes reported, and some convergence in view toward a common understanding of the underlying mechanisms, MNOS-FET, MAOS-FET storage devices do not yet appear to be commercially successful. One objection appears to have been the difficulty in achieving reproducible characteristics. Since storage devices are most useful when assembled into large arrays, non-reproducibility has been a major objection to their use. Furthermore, although a better understanding of the internal physical mechanisms has led to improved device parameters, reported devices have not yet been optimized. Some have overly large thresholds; others have tended to show a deterioration in memory with large amounts of memory cycling, others have suffered from objectionably large decays (with time) in their threshold separations. Thus, improvement in the processing has been needed both to optimize the parameters of the finished devices and to reduce their variability. Furthermore, since the memory elements have been desired for use in arrays, processing had been needed that would lead to ease in fabrication of both the storage and necessary decoding elements.

SUMMARY OF THE INVENTION

Accordingly, it is an object of the present invention to provide an improved method of making an MIS-FET memory device.

It is a further object of the present invention to provide an improved method of making an MIS-FET memory device having high reproducibility.

It is another object of the present invention to provide an improved method of making the double layer insulated gate region of a MIS-FET device.

It is a further object of the invention to provide an improved method of making a MIS-FET memory and decoding device suitable for use in an array.

It is an additional object of the invention to provide an improved MIS-FET device having an improved gate region.

It is another object of the invention to provide an improved MIS-FET device having a structure particularly suited for ease in manufacture.

These and other objects of the invention are achieved in a method of making a metal insulation silicon field effect transistor (MIS-FET) memory device, comprising the steps of forming an insulating $SiO_2$ layer over a low resistivity substrate; etching openings in the $SiO_2$ and diffusing in source and drain regions; resealing the source and drain regions with $SiO_2$ and opening the channel region; immersing the substrate in concentrated nitric acid to form a low temperature chemical oxide over said channel region under self-limiting conditions to a thickness of about 20A; forming a silicon nitride layer of from 300 to 1000A over the chemical oxide by reacting a mixture of $NH_3$ with a small amount of $SiH_4$ (1/7500) at a temperature of from 750° to 850°C to minimize the fixed charge therein; opening the source and drain contact regions; and metallizing the source and drain regions and said silicon nitride layer over said channel region.

More particularly, the nitric acid used in the chemical oxide reaction is concentrated, lying in the range of from 60 – 84% by weight, and conveniently held at the boiling point of the acid (86°C in the case of 84% concentration) during the reaction. The reaction is carried into self-limiting, the period normally required being some time in excess of 20 minutes. The nitride layer is formed using an inert carrier gas including nitrogen, and the range specified includes 830°C, the point at which fixed charge in the nitride layer becomes zero under these conditions. The upper limit, 850°C is selected to avoid crystallinity, and to favor the amorphous form of nitride. The chemical oxide prepared in this manner is porous, and has a large number of physical defects forming both deep and shallow traps. The nitride formed over the oxide leads to the formation of a large number of deep traps at their interface, the number arrived at under the indicated circumstances being about $6 - 8 \times 10^{12}$ traps/cms$^2$. The fixed charge under these circumstances is less than $1 \times 10^{12}$ per /cm$^2$.

Alternatively, an $Al_2O_3$ layer may be substituted for the nitride layer. When this is done the nitride step is replaced by hydrolyzing $AlCl_3$ in a mixture of $H_2$ and $CO_2$ at 900°C. The $Al_2O_3$ layer so formed is then allowed to build up to a relatively large thickness in relation to the oxide layer (>300 A) as in the nitride process.

The process may be extended to permit the formation of a stable gate device to accompany the variable gate device. Both kinds of devices are normally required in the formation of arrays. When this is done, a conventional "thermal" oxide step is added just before the chemical oxide step. The thermal oxide is prepared at a higher temperature of 1000°C and results in an oxide layer ($SiO_2$) typically of 500A thickness.

The MIS-FET which results from this process comprises a low conductivity silicon substrate of one conductivity type and forming a first connection region; a pair of high conductivity diffusions of the other conductivity type spaced to form an intervening narrow width channel region; source and drain metallizations applied to the diffused regions to form corresponding source and drain electrodes; and a gate comprising a chemical oxide of silicon of approximately 20A thickness grown on the surface of the substrate over the channel region for providing a tunneling layer, a second insulating layer whose conduction is substantially less than in said chemical oxide layer and providing a region of deep positive traps at their interface, and a gate metallization applied to the second insulating layer over said channel region to form a gate electrode.

The chemical oxide layer has the properties outlined above in connection with the process description and is highly reproducible. The second insulating layer may take the form of a nitride ($Si_3N_4$) layer or an aluminum oxide ($Al_2O_3$) layer. The finished device is designed to function with the thermal oxide forming the conduction region under high field conditions, while the second insulation layer has minimal conduction, minimum fixed charge, and at its interface with the chemical oxide provides a maximum number of deep traps for establishing the desired variable threshold action. Normally, conduction in the oxide layer is by tunneling. The mode of operation can either be enhancement or depletion mode, and the devices may be either "P" channel or "N" channel.

The preferred embodiment uses a nitride second insulating layer, in a P channel device, with the oxide supporting a tunneling mode of conduction under high field conditions.

BRIEF DESCRIPTION OF THE DRAWING

The novel and distinctive features of the invention are set forth in the claims appended to the present application. The invention itself, however, together with the further objects and advantages thereof may be best understood by reference to the following description and accompanying drawings in which:

Figures 1, 2A, 2B, 2C, 2D, 2E, 2F, 2G, 2H:
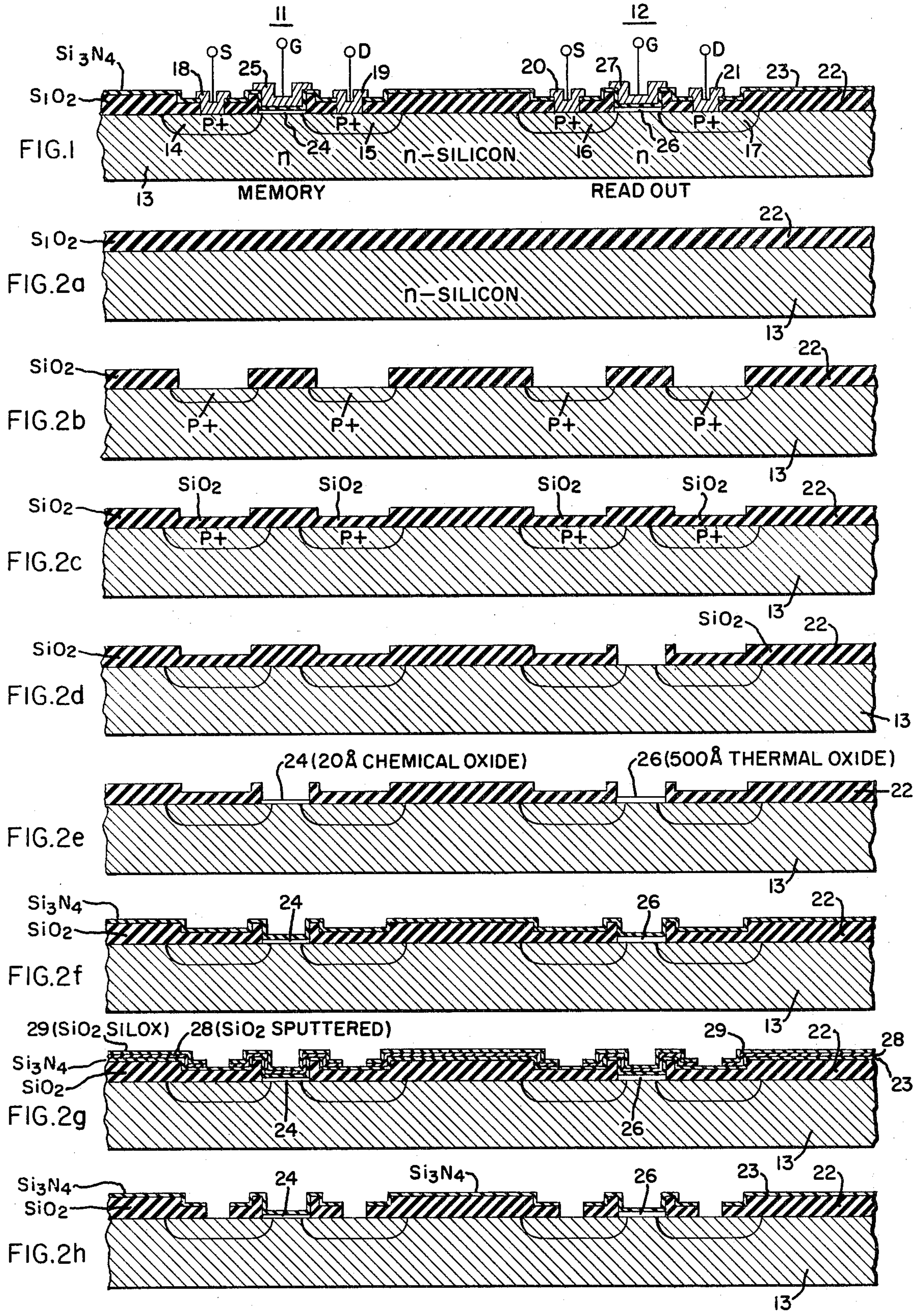
FIG. 1 is an illustration of a MIS-FET memory and decode device in accordance with the invention.
FIG. 2(a) through 2(h) are illustrations of Applicant's novel method of making a MIS-FET memory and decode device, each characterizing a different stage in the fabrication.

DESCRIPTION OF THE PREFERRED EMBODIMENT:

Referring now to FIG. 1, a finished metal insulation silicon field effect transistor (MIS-FET) memory and readout device is illustrated. The insulation layers specifically illustrated are nitride and oxide. The finished structure is one that is readily reproduced in quantities and one which may form an element in a large array. The illustrated pair of FET devices 11 and 12 are P-channel devices formed on a substrate 13 of silicon of low *n* resistivity, normally in the range of from 1 to 20 ohm centimeters. In the memory element 11, a first P+ diffused region at 14 is the source diffusion and spaced to the right at 15 is a second P+ diffused region for the drain. In the readout element 12, a first P+ diffused region 16 is the source diffusion, and spaced to the right is a second P+ diffused region 17 for the drain. All four regions are diffused with Boron to about 50 ohms/sq. Source and drain diffusions are spaced about 0.2 mils apart and thus define two channel regions in the substrate.

The surface of the silicon substrate is covered with two insulating layers which are opened over the diffused and channel regions. The lowermost layer 22 is a relatively thick layer (1.1 microns) of $SiO_2$ having good insulating qualities, and it is covered by an appreciably thinner layer 23 (300 to 1000A) of $Si_3N_4$, also having good insulating qualities. The nitride layer, as will appear, serves both to passivate the underlying silicon, and in the channel region, is a part of the gate insulation. The electroding 18, 19, 20, 21 to the source and drain regions contact the substrate through the openings in the insulating layers. The contacts each comprise a thin initial deposition of titanium (200A) followed by a more substantial deposition of aluminum (7000A). The contacts are alloyed to the underlying diffused region. As so far described, the source and drain constructions, and the doping levels are conventional.

The insulating gates, while unique in several respects, are of a conventional configuration. The memory gate comprises a double layer whose undermost layer is a unique, chemically formed thin (20A) oxide 24. The upper layer is the $Si_3N_4$ layer 23 previously noted. The gate is electroded by a Ti-Al metallization like that for the source and drain. The gate metallization is applied on top of the two layers as shown at 25. In the readout device 12, the stable gate comprises a thicker (500A) underlayer 26 of thermal oxide, the $Si_3N_4$ layer, and finally a similar Ti-Al metallization 27 forming the gate electrode.

The memory gate oxide is normally about 20A units in thickness, although it can be made slightly thinner. While the thickness selected is not unusual, the nature of the oxide is. It is chemically unusual in that the oxide is approximately SiO, the oxygen being present in quantities slightly larger than 1 to 1. The oxide, when formed by reaction with concentrated nitric acid at 86°C, and in the manner to be described more fully below, appears to have many voids of a near molecular size and to have a generally porous and irregular structure. The indicated reaction process permits easy control of thicknesses at 20A and slightly below. An ellipsometer reading indicates the index of refraction of the chemical oxide layer to be about 2.4 as opposed to 1.6 for conventional $SiO_2$.

The $Si_3N_4$ layer, as will be described more fully below, is also applied in conventional thicknesses, normally from 300 to 1000A. The deposition involves the pyrolytic reaction between $NH_3$ and $SiH_4$ in trace quantities (1 part in 7500), with a nitrogen carrier and no hydrogen present. The temperature is carefully controlled to a value between 750°C and 850°C. This temperature produces a minimum initial charge density — and accordingly a minimum gate threshold — without losing other desirable nitride properties. At the same time, the temperature selection allows the nitride to form on the chemical oxide without substantial deterioration of the oxide and with the formation of a near optimum number of deep traps.

A device which is made in the manner specified, using the indicated thin chemical oxide 20A in combination with the $Si_3N_4$, exhibits no measurable loss in storage capability from repeated cycling ($10^9$), a low threshold (−3 volts in a typical case), and a threshold separation of −7 volts. The value is held for a year at 20% drop.

The immunity to degradation from cycling of the present device is believed to lie in the nature of the chemical oxide layer. Some correspondingly thin thermal oxide layers have been reported to have shown degradation after $10^5$ cycles. The chemical oxide has not shown observable degration after $10^9$ cycles. The chemical oxide is formed at a low temperature (86°C) in a manner which permits a larger number of physical defects than in high temperature oxidation. These defects consist of both deep and shallow density, such as voids, lattice vacancies, vacancy clusters, dangling bonds, etc. Many of these defects are of a kind that continued tunneling would tend to induce. Thus, in the chemical oxide, where there is near saturation in defects of this kind, the tunneling which accompanies cycling of the memory cell is not believed to produce significantly more. This is believed to explain why repeated cycling produces no observable changes in the operation of the chemical oxide layer.

By contrast, the thermal oxide layer appears to alter slightly with the repeated tunneling accompanying cycling. These produce additional shallow defects, which, while not harmful in an initial device, perceptibly alter its electrical characteristics in the memory unit being cycled. Thus, in an array, if some units are altered while others are not, their non-uniformity creates a severe operational problem, jeopardizing the entire array.

As previously noted, the oxide layer that is used in the memory element is formed by reacting the silicon substrate with concentrated nitric acid (at 86°C), the boiling point of the acid, for about 20 minutes. This method of treatment leads to the formation of a thin oxide, and one that is of reproducible thickness and electrical properties.

The method involves treatment of the silicon surface with a concentrated nitric acid solution immediately after cleaning. The process produces a repeatable layer by careful selection of the processing conditions; temperature, acid purity and concentration, and time. The very low temperature and long time (20–30 minutes) involved facilitates control of the process.

The $HNO_3$ oxidation process is believed to proceed via an intermediate series of autocatalytic reactions in which $HNO_2$ is first formed by reactions between $N_2O_4$, NO and water as follows:

$$N_2O_4 + H_2O \rightleftarrows HNO_2 + HNO_3 \quad (1)$$

$$N_2O_4 + NO + 2\,H_2O \rightleftarrows 4\,HNO_2 \quad (2)$$

It is also well known that surface atoms of silicon are active so that at room temperature in air they form oxides as large as 8A. The oxidation step in the film growth process involves the formation of positive Si ions:

$$Si \rightarrow Si^{++} + 2e^{-} \quad (3)$$

In concentrated $HNO_3$, the potential difference between the silicon and negative electrolyte is as much as 0.5V and the ionization and ion migration through the thin oxide will be enhanced by this potential. The electrical field of the silicon interface falls very rapidly, and is believed to operate first to attract very strongly, and then less strongly oxidizing ions into contact with the less mobile Si ions. The silicon ions thus react with $HNO_2$, which is a more active oxidizing agent than $HNO_3$, according to the reaction:

$$2\ HNO_2 \rightarrow H_2O + NO + 2O^{--} \quad (4)$$

$$Si^{++} + O^{--} \rightarrow SiO \quad (5)$$

This produces a monoxide rather than the dioxide, although the compositon is not believed to be stoichiometric, but to vary slightly about 1 to 1.

Like chemical stain films on silicon, the rate of film growth, for the initial state of oxidation, appears to follow a quadratic form:

$$dx/dt \ \alpha \ k_R/2x \quad (6)$$

where $x$ is the thickness, and $K_R$ the rate constant, depending on the temperature:

$$k_R \ \alpha \ \exp(-E_a/kT) \quad (7)$$

where $E_a$ is the thermal activation energy. For low concentrations, the initial oxidation rate is also proportional to the molar concentration of $HNO_3$:

$$dx/dt \ \alpha \ C^n \exp(-E_a/kT) \quad (8)$$

where $C$ is the concentration of $HNO_3$ in moles per liter, $n$ is the reaction order.

Typically, a treatment time of 20–30 minutes in concentrated $HNO_3$ was selected. To stabilize temperature, the acid was boiling (86°C) and refluxed to insure constant concentration. Electronic grade $HNO_3$, specifically free of sodium was used rather than reagent grade acid.

The reaction is readily controlled because the conditions noted above lead to self-limiting. Applicant's experiments show that with concentrated nitric acid, the reaction proceeds at the parabolic rate for about 10 minutes. After this period the oxide build up begins to slow down, and appears to come to a practical stop after about 20 minutes from start. The final thickness is slightly dependent upon the concentration of the acid. Operation with lesser concentrations of nitric acid than 60% have led to difficulty in achieving reproducibility. Concentrations from 60 percent to 84% lead to reproducible thicknesses of the oxide layer. The nitric acid reaction permits the formation of layers that are substantially thicker than the residual oxide. An oxide thickness of 20A versus 15A represents a difference in storage time between years and weeks. Usage below 15A is thus less promising from both the matter of reproducibility and non-volatility.

Use of the boiling temperature (86°C) is not critical, except that temperature also influences the initial process rate. Thus, the process may be conducted at the particular boiling point of the concentrations of acid used or at some regulated temperature. At a lower temperature an additional allowance of time for the reaction to self-limit may be necessary (30 minutes versus 20 minutes).

As earlier noted, the oxide layer is thin, approximately 20A, while the nitride layer is widely variable and thicker (300 – 1000A). This oxide thickness is thin enough to be fast and is readily reproduced with substantial uniformity. If a slower or faster, or higher or lower voltage gate action is sought, most control can be obtained by adjusting the thickness of the nitride layer. Standardizing the oxide layer has tended to standardize the conduction and discharge phenomena since the nitride is made thick enough to force conduction through the oxide at all times. At the interface of the two layers, differences in lattice dimenison, irregularities and assorted physical property mismatches form the large number of deep traps responsible for the storage phenomena. This remains the same irrespective of the thickness of the nitride layer.

In the oxide layer, avalanche injection occurs from the substrate under high field polarity conditions. Assuming an n-p condition, electrons can be injected into the oxide conduction band. Tunneling occurs throughout the forbidden energy gap when the oxide is thin as herein contemplated. The dominant conduction mechanism is Fowler-Nordheim emission, itself dependent on the presence of thermally excited electrons to exceed the barrier.

The nitride, on the other hand, is sufficiently thick (even at 300A) so that tunneling is forbidden and Poole-Frankel conduction is predominant, i.e. field enhanced thermal excitation of trapped electrons into the nitride conduction band. Calculations show that the oxide conduction is $5.4 \times 10^{-4}$ amperes/cm$^2$ at a field of $8 \times 10^6$ V/cm (zero stored charge. Also assuming a stored charge at the interface of $6.0 \times 10^{+12}$ states/cm$^2$, the oxide current is reduced to $1.46 \times 10^{-13}$ amperes/cm$^2$. Thus, as the interface approaches saturation, the oxide charging ceases. On the other hand, the nitride current using a field of b 3.7 $\times$ 10$^6$V/cm is 1.1 + $10^{-10}$ amperes/cm$^2$. Thus, during charging the nitride current is negligible, in relation to current through the oxide. Analysis of the decay currents also shows that the charge decay is through the oxide layer rather than the nitride.

The predicted displacement in threshold voltages is approximately:

$V_T = Q_I(t)/C_N$ Where $Q_I(t)$ is the time dependent charge density in the oxide-nitride traps, and $C_N$ is the nitride capacitance per square centimeter. Typical observed separations are 7 to 8 volts, the stored charge corresponds to $7 \times 10^{12}$ traps per cm$^2$, and the threshold is below 3 volts.

The technique for achieving threshold voltages as low as one volt is largely dependent upon the nitride processing. The threshold voltage, $V_T$, depends on the substrate carrier concentration, the amount of fixed charge in the dielectric, and the difference in work function between the silicon and metal ($\phi_{MS}$) involved. Since $V_T$ for P-channel devices is relatively insensitive to concentration ranges below $10^{15}$ atoms/$cm^3$, and since $\phi_{MS}$ is fixed for a given metal system, $V_T$ depends primarily on the initial fixed charge density ($Q_{IC}$) in the two dielectric layers. Since the oxide layer is thin in relation to the nitride, and the initial fixed charge in the oxide made as small as possible, the remaining and more important control of the initial fixed charge in the gate insulation is in the formation of the nitride layer.

To obtain a minimum initial charge, we found that a high $NH_3/SiH_4$ ratio is needed and the carrier should be an inert gas including nitrogen. Hydrogen should not be present. These steps reduce positive silicon or hydrogen ions in the nitride. However, the most important parameter controlling the value of the initial charge is the deposition temperature. This effect has been reported in the *Journal of Applied Physics*, 15 Dec. 1969, pages 408, 409, in a letter by E. C. Ross et al.

The deposition temperature appears to cause a slight departure in stoichiometry between the reacting elements. At the lowest temperatures an excess of silicon ions occurs resulting in very deep "+" states. These states are too deep for conduction, but act to neutralize the gate field. As the deposition temperature increases, this "initial" charge falls until it crosses through zero at 830°C and gradually assumes negative values. The number of states remains low over a substantial temperature range $>1 \times 10^{12}(+)$ atoms/$cm^2$ at 750°C and $>1 \times 10^{12}(-)$ atoms/at 1000°C. At temperatures above 900°C, however, the deposition creates problems in deposition of crystalline $Si_3N_4$ particles while the amorphous form is desired, and the possibility of deterioration of the underlying chemical oxide layer. The observed maximum charge appears to be quite high throughout this region (from $6 - 8 \times 10^{12}$ states/$cm^2$). Thus, for optimization of the minimum threshold, the region about 830° is preferred. The usable range appears to be from 750°C to about 850°C.

To complete the process of making the MIS-FET memory and readout element is illustrated in FIGS. 2(a) through 2(h). Five masks are required in the process.

The starting material for the MIS-FET device is typically a 2 ohm centimeter, N-type silicon wafer with a [100] crystal orientation. The material is normally within the range of 1 – 20 ohms cm. The wafer surface is optically polished and carefully cleaned before starting the initial oxidation. The cleaning starts with a solvent, then aqua regia; ammonium hydroxide ($NH_4OH$) and hydrogen peroxide ($H_2O_2$); and finally 5% hydrofluoric acid. After this, the surface is rinsed in distilled water having a purity of in excess of $10^6$ ohm centimeters. After rinsing, the substrate is ready for the initial oxidation.

The initial oxidation is a thermal oxidation which provides a layer of $SiO_2$ to a uniform depth of 1 micron over the top of the wafer. The oxidation is carried on at 1100°C, using steam for 2 hours. At the end of the oxidation the substrate appears as illustrated in FIG. 2(a).

The $SiO_2$ layer is then etched through the $SiO_2$, using a first mask to form the source and drain openings as shown in FIG. 2(b). The mask is a photoresist mask applied and formed in place in a conventional manner. The etching of the $SiO_2$ takes place at about room temperature (20°C) using 15% solution of hydrofluoric acid for 10 minutes.

After etching, the exposed silicon is carefully cleaned preparatory to the boron diffusion of the source and drain regions. The cleaning procedure normally involves some of the same steps as the initial cleaning procedure; aqua regia, ammonium hydroxide, 5 percent hydrofluoric acid and rinsing in distilled water.

With clean openings as shown in FIG. 2(b), the borom diffusion is undertaken to form source and drain diffusions. This step takes place at a wafer temperature of 1120°C for 1 hour in a diffusion furnace. The boron source is a mixture of 0.25% $BCl_3$ in $N_2$ and controlled to achieve a sheet resistivity of 50 ohms/sq. Small quantities of $H_2$ and $O_2$ are also normally present in the source. The diffusion is conventional and may use other procedures.

The source and drain diffusions are then sealed with a 6000A layer of $SiO_2$. The oxidation takes place with an initial dry $O_2$ at 1120°C for 10 minutes, then in steam at 1120°C for 30 minutes, followed by dry $O_2$ at 1120°C for 30 minutes more. The duration and temperature of this step is designed to drive in the boron diffusion and to narrow the channels between sources and drains. At this point the substrate is as illustrated in FIG. 2(c).

Using a second mask, and a conventional photoresist process, the $SiO_2$ is now opened up over the channels in the readout element. The opening must expose narrow regions to either side of the channel as illustrated in FIG. 2(d). The process entails exposure to 15% HF at 20°C for 10 minutes through a photoresist mask. After the etching, the photoresist is removed and the surface is cleaned by the cleaning procedure earlier mentioned.

The exposed channel region for the readout element is then oxidized from a thick thermal oxide. The process is conventional, using dry $O_2$ at 1000°C and is typically timed to form a layer of 500A thickness.

After the formation of the "thick" oxide, the thin chemical oxide layer is formed in the memory element. This requires a third mask providing openings over the channel region, and a repetition of the etching and cleaning steps.

The thin oxide gate is formed as shown in FIG. 2(e). The substrate is submerged in boiling (86°C) nitric acid (electronic grade) for about 20 minutes. A thin layer of oxide of about 20A is formed over the exposed silicon. The composition, as has been explained, due to the low temperature formation, and disassociation activity of nitric acid forms a near $Si_1O_1$ composition, rather than $SiO_2$.

Nitride is then deposited over the substrate to a thickness of 300 to 1000A to form the nitride layer for both gate regions. According to one procedure, it is formed by the pyrolysis of $SiH_4$ with $NH_4$ at 850°C using a carrier of argon or nitrogen. $H_2$ should not be present. The ratio of $NH_3$ to $SiH_4$ is 7,500 to 1. The nitride deposits at the rate of about 180A per minute, and the process only need run for about 5 minutes. During the deposition, which uses a vertical reactor heated by an r.f. generator, the wafers are rotated to allow for uniform deposition into the openings. The nitride must be particularly clean, and the use of high purity gas sources essential. At this temperature, the nitride layers remain amorphous and minimum threshold devices result. At this stage, the device is as shown in FIG. 2(f).

The nitride formed over the thermal oxide in the "stable" gate and over the chemical oxide in the variable threshold gate forms the second insulating layer in both the readout and memory devices. In the memory device, its presence creates a large trap density in the SiO-$Si_3N_4$ interface essential to variable threshold operation.

The nitride layer is useful for passivating the $SiO_2$ generally, but must now be removed over the source and drain regions before the electroding. The nitride is inert to most chemicals and its localized removal somewhat difficult. The preferred removal method is to use a fourth photoresist mask with a supplementary deposition of $SiO_2$. With the photoresist mask in place covering over the source and drain regions, $SiO_2$ is first sputtered to a depth of 1000A over the surface of the substrate. The sputtered $SiO_2$ has good adhesion to the $Si_3N_4$. Next, 3000A of $SiO_2$ is deposited using a conventional siloxane deposition at 400°C. The double $SiO_2$ layer avoids undercutting and is pinhole free. The photoresist and the $SiO_2$ covering it are then removed from the source and drain windows to expose the $Si_3N_4$ layer for its removal as shown in FIG. 2(g).

The $Si_3N_4$ layer is etched away using $H_3PO_4$ acid at 80°C for 15 minutes. This exposes the thin 6000A layer of $SiO_2$ over the sources and drains. Using 15% HF for 6 minutes, the $SiO_2$ mask (4000A) and the 6000A double layer $SiO_2$ over the source and drain regions are etched away. This stage of the substrate is illustrated in FIG. 2(h). The etching exposes the diffused source and drain regions on the substrate. The HF etching stops at the nitride layers protectively covering the earlier $SiO_2$ layers. After cleaning, the exposed source and drain regions are now ready for metallization.

Electrode metallization of the source, gate and drain regions is then applied in a conventional manner using an electron beam evaporator and the fifth mask. The preferred metallization involves a thin (200A) initial layer of titanium, followed by an aluminum deposition of 7000A carried on at a substrate temperature of 100C. After removal of the mask, electrodes are "alloyed" in a nitrogen atmosphere for 15 minutes at a temperature of 500°C.

While the chemical oxide has been disclosed as an insulating layer in an MNOS structure involving enhancement mode operation of a P-channel device, other variations are possible. The chemical oxide layer may also be used in depletion MNOS devices in a P-channel configuration as well as in enhancement mode devices in an N-channel tetrode arrangement (using Schottky injection). The chemical oxide may also be used in MAOS devices wherein the A stands for $Al_2O_3$. One such device is an N-channel device using enhancement mode operation. The chemical oxide may also be used in a P-channel device operating in a depletion mode with either a tunneling or avalanche injection mode of charging. In general, the formation of aluminum oxide devices is well known and follows the same general process as herein described in the fabrication of an MNOS device. The nitride reaction in particular is replaced by hydrolyzing $AlCl_3$ in a mixture of $H_2$ and $CO_2$ at 900°C to form the $Al_2O_3$ layer. The dimensioning of the $Al_2O_3$ layer follows the same principles used in the $Si_3N_4$ layer. The $Al_2O_3$ layer thus is substantially thicker than the chemical oxide >300A, and lies in the same range of thicknesses as the nitride layer.

I claim:

1. The method of making a metal insulation silicon field effect transistor (MIS-FET) memory device, comprising the steps of:

a. forming an insulating $SiO_2$ layer over a low resistivity substrate, b. etching openings in said $SiO_2$ layer and diffusing in source and drain regions, c. sealing said source and drain regions with $SiO_2$ and opening an intermediate channel region, d. immersing the substrate in concentrated nitric acid to form a low temperature chemical oxide of silicon over said channel region under self-limiting conditions in order to produce a first insulating layer about 20A in thickness, e. forming a second insulation layer over said chemical oxide to provide a region of deep traps at their interface, f. opening said source and drain contact regions, and g. metallizing said source and drain regions and said second insulating layer over said channel region.

2. The method of claim 1 wherein during formation of said chemical oxide, the concentration of said nitric acid is in excess of 60 percent by weight and maintained at a constant temperature, said reaction continuing for at least 20 minutes.

3. The method of claim 2 wherein said constant temperature is set at the boiling point of said nitric acid.

4. The method of claim 3 wherein said acid is 84 percent by weight and said boiling point is 86°C.

5. The method of claim 1 wherein said second insulating layer is silicon nitride, said formation occuring by reacting a mixture of $NH_3$ with a small amount of $SiH_4$ at a temperature of from 750°C to 850°C to minimize the fixed charge therein, and the upper limit favoring the formation of the amorphous form of nitride, and avoiding crystallinity

6. The method of claim 1 wherein said second insulating layer is $Al_2O_3$ formed by hydrolyzing $AlCl_3$ in a mixture of $H_2$ and $CO_2$ at 900°C.

* * * * *